(12) United States Patent
Nilsen et al.

(10) Patent No.: US 10,212,835 B1
(45) Date of Patent: Feb. 19, 2019

(54) DEVICE WITH LATCHED BATTERY CAVITY

(71) Applicant: Bose Corporation, Framingham, MA (US)

(72) Inventors: Thomas Aquinas Nilsen, Auburn, MA (US); Lino Antony Pucci, Wellesley Hills, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 15/851,809

(22) Filed: Dec. 22, 2017

(51) Int. Cl.
*H05K 5/02* (2006.01)
*H05K 5/00* (2006.01)

(52) U.S. Cl.
CPC ......... *H05K 5/0221* (2013.01); *H05K 5/0086* (2013.01)

(58) Field of Classification Search
CPC combination set(s) only.
See application file for complete search history.

(56) References Cited

U.S. PATENT DOCUMENTS

| | | | |
|---|---|---|---|
| 4,959,810 A | 9/1990 | Darbee et al. | |
| 5,422,783 A | 6/1995 | Darbee | |
| 5,665,000 A * | 9/1997 | Burrell | H01H 9/0214 174/67 |
| 5,931,513 A * | 8/1999 | Conti | E05C 19/066 220/324 |
| 7,274,554 B2 * | 9/2007 | Kang | H01M 2/1066 361/679.01 |
| 8,085,529 B2 * | 12/2011 | Zhang | H01H 13/705 361/679.01 |
| 8,094,439 B2 * | 1/2012 | Lin | H01M 2/1066 361/679.01 |
| 8,223,490 B2 * | 7/2012 | Dong | E05C 3/162 361/679.01 |
| 8,231,994 B2 * | 7/2012 | Zhou | H04M 1/0262 361/679.01 |
| 8,241,777 B2 * | 8/2012 | Dong | H01M 2/1066 361/679.01 |
| 8,243,441 B2 * | 8/2012 | Xu | E05C 19/006 361/679.01 |
| 8,254,114 B2 * | 8/2012 | Lin | E05B 65/006 361/679.01 |
| 8,257,859 B2 * | 9/2012 | Xie | H01M 2/1022 221/282 |

(Continued)

OTHER PUBLICATIONS

Brooke Higginbotham, UL Announces New Standard for Products Using Lithium Button or Coin Cell Batteries, Newsroom, Press Releases, Mar. 16, 2015, 3 pages, Northbrook, Ill.

*Primary Examiner* — Lisa Lea-Edmonds
(74) *Attorney, Agent, or Firm* — Hoffman Warnick LLC

(57) ABSTRACT

Various implementations include devices with a latched battery cavity. In one implementation, a device includes: a body; a cavity within the body for holding a battery; a lip extending at least partially about the cavity; and a latch coupled with the body proximate the cavity for regulating movement of the battery in the cavity, wherein the latch requires multi-stage actuation to permit removal of the battery from the cavity, wherein the latch is actuatable to translate in a direction transverse to an outer surface of the battery and to depress in a direction substantially perpendicular to the direction transverse to the outer surface.

20 Claims, 6 Drawing Sheets

(56) References Cited

U.S. PATENT DOCUMENTS

| | | | | | |
|---|---|---|---|---|---|
| 8,264,836 | B2* | 9/2012 | Peng | ................... | H01M 2/1066 292/175 |
| 8,334,065 | B2* | 12/2012 | Lao | ................... | H01M 2/1022 361/679.01 |
| 8,422,209 | B2* | 4/2013 | Cheng | ................ | H01M 2/1022 361/679.01 |
| 9,030,818 | B2* | 5/2015 | Tatsukami | ........... | H05K 5/0221 16/334 |
| 9,036,335 | B2* | 5/2015 | Liang | .................. | H05K 5/0221 361/679.01 |
| 9,632,540 | B2* | 4/2017 | Senatori | ................ | G06F 1/1633 |
| 9,844,158 | B2* | 12/2017 | Shi | ..................... | H04M 1/0262 |
| 2006/0234545 | A1* | 10/2006 | Shi | ....................... | G11B 33/027 439/521 |
| 2009/0303668 | A1* | 12/2009 | Zhao | .................. | H01M 2/1066 361/679.01 |
| 2010/0027203 | A1* | 2/2010 | Lu | ....................... | H04M 1/0252 361/679.01 |
| 2010/0165552 | A1* | 7/2010 | Yang | .................. | H04M 1/0262 361/679.01 |
| 2010/0328858 | A1* | 12/2010 | Xiong | ................. | H01M 2/1061 361/679.01 |
| 2011/0130799 | A1* | 6/2011 | Kubat | .................. | A61N 1/3968 607/5 |
| 2011/0149487 | A1* | 6/2011 | Lin | ..................... | H01M 2/1066 361/679.01 |
| 2011/0157783 | A1* | 6/2011 | Huang | ................ | H04M 1/0262 361/679.01 |
| 2011/0304959 | A1* | 12/2011 | Wang | .................. | G06F 1/1635 361/679.01 |
| 2012/0039025 | A1* | 2/2012 | Chen | .................. | H01M 2/1022 361/679.01 |
| 2012/0050963 | A1* | 3/2012 | Chen | .................. | H01M 2/1066 361/679.01 |
| 2012/0087071 | A1* | 4/2012 | Yang | ........................ | E05C 1/04 361/679.01 |
| 2012/0120565 | A1* | 5/2012 | Chen | .................. | H01M 2/1066 361/679.01 |
| 2013/0242476 | A1* | 9/2013 | Tu | ....................... | H01M 2/0404 361/679.01 |

* cited by examiner

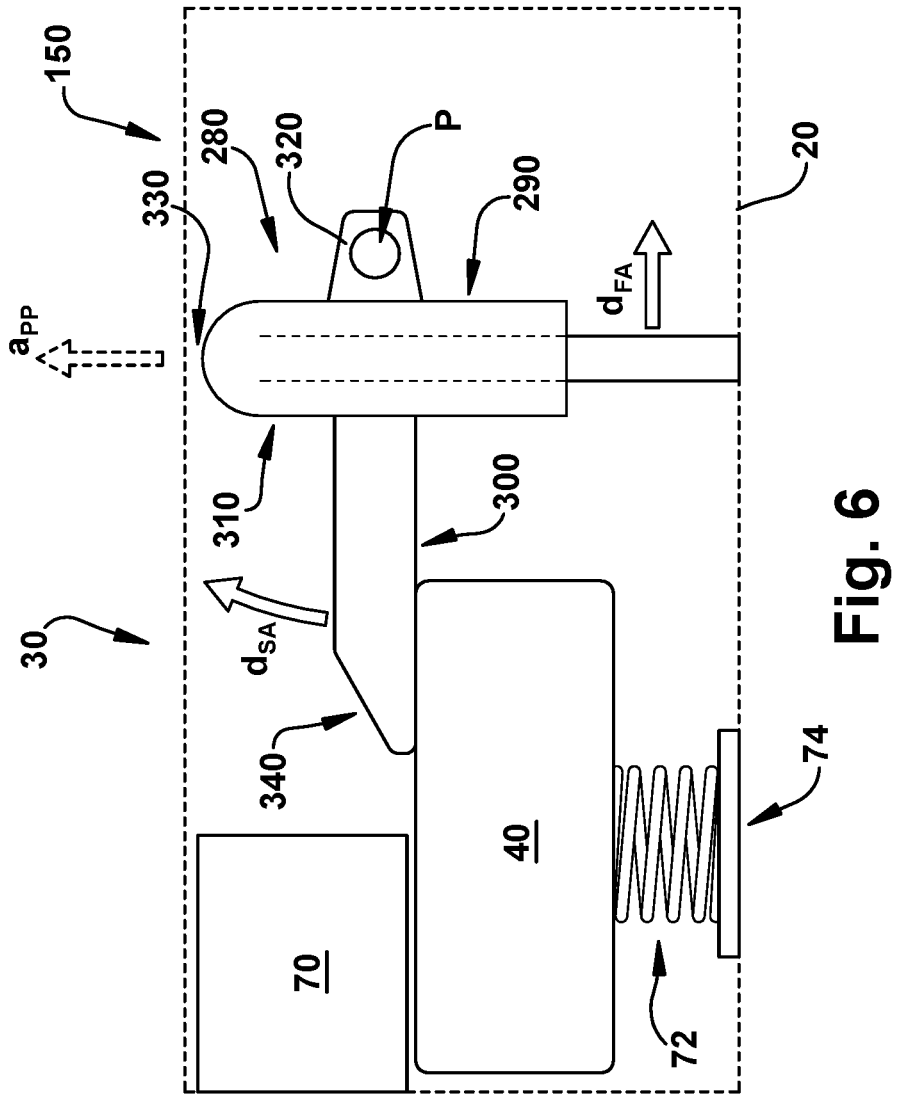

DEVICE WITH LATCHED BATTERY CAVITY

TECHNICAL FIELD

This disclosure generally relates to device safety features. More particularly, the disclosure relates to a battery cavity for effectively retaining a battery according to prescribed safety standards.

BACKGROUND

Household-type products, in particular those with small parts, are commonly subject to regional or international safety standards. In some cases, these safety standards are intended to prevent those small parts from becoming separated and accidentally ingested by children. For example, small-scale battery components in electronic devices can be subject to regional or international safety standards. One such standard relates to button or coin cell batteries in household-type products. However, complying with these safety standards within the design constraints of household-type items can be challenging.

SUMMARY

All examples and features mentioned below can be combined in any technically possible way.

Various implementations include a device with a battery cavity having a latch for retaining a battery. In some implementations, the battery cavity includes a latch with a multi-stage actuation mechanism to release the battery from the cavity.

In some particular aspects, a device includes: a body; a cavity within the body for holding a battery; a lip extending at least partially about the cavity; and a latch coupled with the body proximate the cavity for regulating movement of the battery in the cavity, wherein the latch requires multi-stage actuation to permit removal of the battery from the cavity, wherein the latch is actuatable to translate in a direction transverse to an outer surface of the battery and to depress in a direction substantially perpendicular to the direction transverse to the outer surface.

In other particular aspects, a device includes: a body; a cavity within the body for holding a battery; a lip extending at least partially about the cavity, where the lip extends over the cavity to partially retain the battery; and a latch coupled with the body proximate the cavity for regulating movement of the battery in the cavity, where the latch requires multi-stage actuation to permit removal of the battery from the cavity, and the battery is retained in the cavity by the lip until the multi-stage actuation of the latch is complete.

In certain implementations, the cavity includes an opening at an exterior wall of the body.

In particular aspects, the lip partially restricts movement of the battery in the cavity.

In some cases, the multi-stage actuation includes two-stage actuation. In particular implementations, the two-stage actuation includes a first stage in a first actuation direction and a second stage in a second actuation direction distinct from the first actuation direction.

In certain aspects, the latch includes: a cantilever arm coupled with the body; and a locking member coupled with the cantilever arm for engaging the battery. In particular implementations, the body further includes: a slot extending from the cavity; and a seat within the slot. In some cases, the locking member further includes: a main body; a first hook extending from the main body for engaging the battery; and a second hook extending from the main body for engaging the seat within the slot. In some cases, the first hook includes a first tapered edge, and wherein the second hook includes a second tapered edge.

In particular implementations, the latch includes: a spring arm coupled with the body; and a locking member coupled with the spring arm for engaging the battery. In certain cases, the spring arm is coupled with the body at two distinct locations and spans substantially across the cavity. In some aspects, the body further includes: a slot extending from the cavity; and a seat within the slot, where the locking member further includes: a main body; a first hook extending from the main body for engaging the battery; and a second hook extending from the main body for engaging the seat within the slot. In certain cases, the first hook has a first tapered edge, and the second hook has a second tapered edge.

In particular implementations, the latch includes: a post coupled with the body; and a locking member coupled with the post for engaging the battery. In some cases, the post has an internal slot, and the locking member is pivotably attached to the post at the internal slot. In certain aspects, the locking member further includes an actuatable tab for pivotably engaging the locking member to engage or disengage the battery.

In particular cases, the lip extends over the cavity to partially retain the battery, where the battery is retained in the cavity by the lip until the multi-stage actuation of the latch is complete.

In certain aspects, the battery includes a cell-type battery.

In some implementations, the device includes a remote control device.

Two or more features described in this disclosure, including those described in this summary section, may be combined to form implementations not specifically described herein.

The details of one or more implementations are set forth in the accompanying drawings and the description below. Other features, objects and benefits will be apparent from the description and drawings, and from the claims.

BRIEF DESCRIPTION OF THE DRAWINGS

FIG. 6 shows a side cross-sectional depiction of a latch in the device of FIG. 5, according to various implementations.

Figure 1:
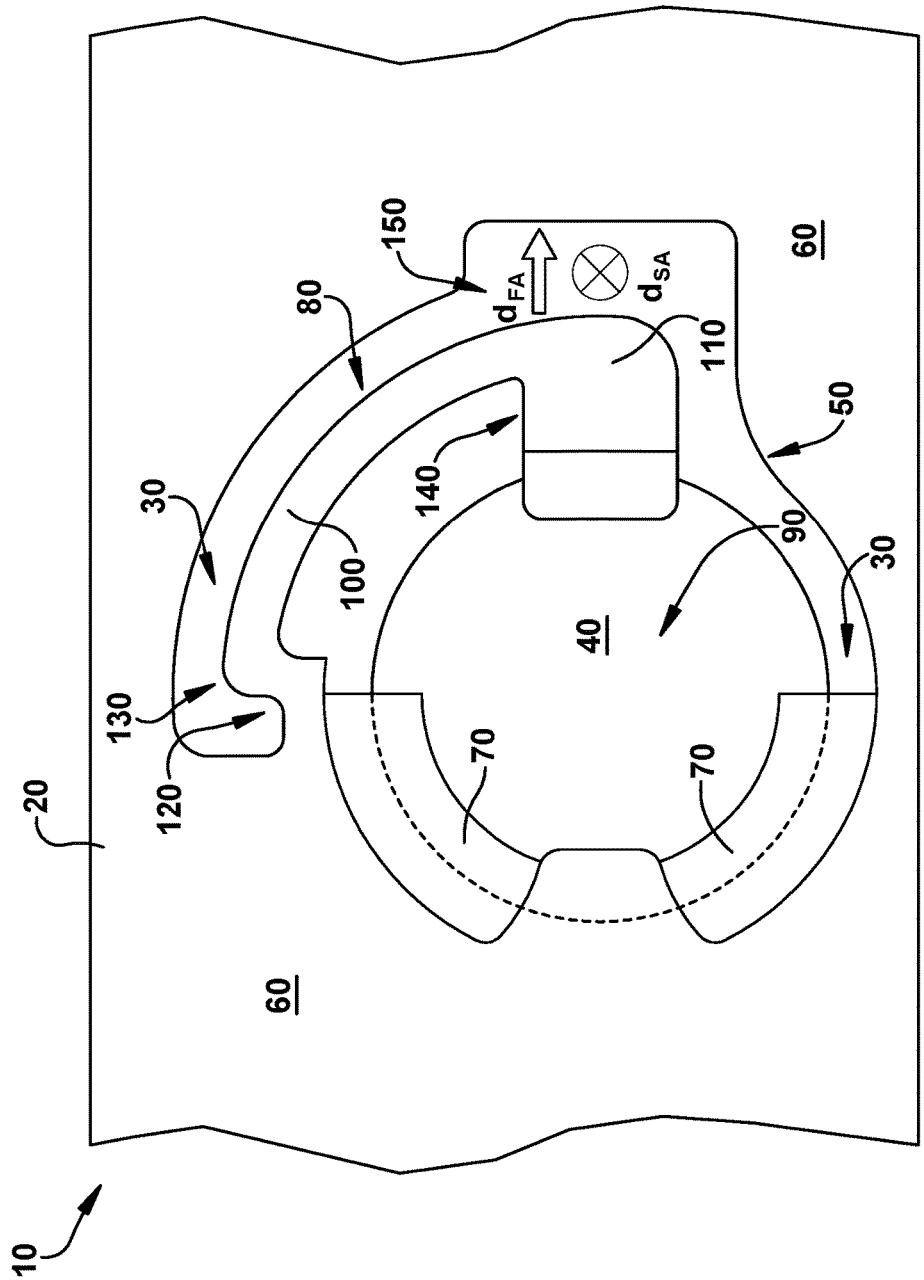
FIG. 1 shows a sectioned plan view of a device according to various implementations.

It is noted that the drawings of the various implementations are not necessarily to scale. The drawings are intended to depict only typical aspects of the disclosure, and therefore should not be considered as limiting the scope of the implementations. In the drawings, like numbering represents like elements between the drawings.

DETAILED DESCRIPTION

This disclosure is based, at least in part, on the realization that a latch can be beneficially incorporated into a device to retain a battery. For example, a device with a battery cavity includes a latch with a multi-stage actuation mechanism to release the battery from the cavity.

Commonly labeled components in the FIGURES are considered to be substantially equivalent components for the purposes of illustration, and redundant discussion of those components is omitted for clarity.

As noted herein, household-type devices, in particular those with small parts, are commonly subject to safety standards intended to prevent ingestion of those small parts by children. For example, the safety organization Underwriters Laboratories (also referred to as "UL"), details a standard (UL 4200A) for button or coin cell batteries in consumer products which requires that liberation of those batteries from the device comply with defined methods. Various implementations disclosed herein include devices with a battery retention latch in compliance with safety standards, including UL standards such as UL 4200A.

FIG. 1 shows a sectioned plan view of a device 10 according to various implementations. It is understood that this section of the device 10 depicted in FIG. 1 is intended to illustrate aspects of the various implementations, and that some aspects of the device 10 may not be illustrated in this view. As described herein, the device 10 can include an electronic device, such as a portable electronic device. In various implementations, the device 10 includes a remote control device configured to control one or more other devices (e.g., content delivery devices).

According to various implementations, device 10 includes a body 20, with a cavity 30 for holding a battery 40. In some cases, the body 20 is formed at least partially of a plastic such as a conventional plastic found in consumer electronic devices. In some cases, the plastic is a hard plastic formed from a mold or otherwise manufactured (e.g., using three-dimensional manufacturing techniques). As noted herein, the battery 40 can include a conventional battery capable of installation and removal in the cavity 30. In particular cases, the battery 40 includes a cell-type battery such as a button cell battery or a coin cell battery.

The cavity 30 is sized to hold the battery 40, such that it has a depth (measured into the page) and a diameter greater than the battery 40, with clearance sufficient to permit movement of the battery 40 into and out of the cavity (according to other limitations described herein). In this sense, the cavity 30 includes an opening 50 at a wall 60 of the body 20. In some cases, this wall 60 is an exterior wall of body 20. However, it is understood that the device 10 can further include a cover or additional casing material (not shown) for covering at least a portion of the wall 60, including opening 50. In any case, opening 50 can permit access to the cavity 30, such that the battery 40 can be installed or removed from the cavity 30 via the opening 50.

As shown in FIG. 1, according to various implementations, the device 10 can further include a lip 70 extending at least partially about the cavity 30, e.g., around the cavity 30 where cavity 30 has an at least partially rounded or arced shape. However, in other implementations, lip 70 extends at least partially across the cavity 30, obstructing a portion of the cavity 30 when viewed from an upper surface of the device 10. In some cases, lip 70 extends from the body 20 and overhangs the cavity 30 within the body 20. In particular implementations, the lip 70 is coupled with the wall 60. In these cases, the lip 70 can be integral with the wall 60, such that the lip and the wall 60 are formed of a substantially similar composition. In certain other cases, the lip 70 is formed of a distinct material from the wall 60, and may be coupled with the wall 60, e.g., via conventional bonding, fastening or adhesive. In certain implementations, the lip 70 can include one or more tab(s), pin(s), overhang(s) or other member(s) extending from the wall 60 over the cavity 30. According to some implementations, the lip 70 sits beneath the wall 60 such that it is closer to the outer surface 90 of the battery 40 when the battery 40 is resting within the cavity 30 than the wall 60. In these instances, the lip 70 may be positioned to provide minimal clearance (e.g., approximately 0.5 mm) for the battery 40 to aid in retaining the battery 40 within the cavity 30.

Figure 2:
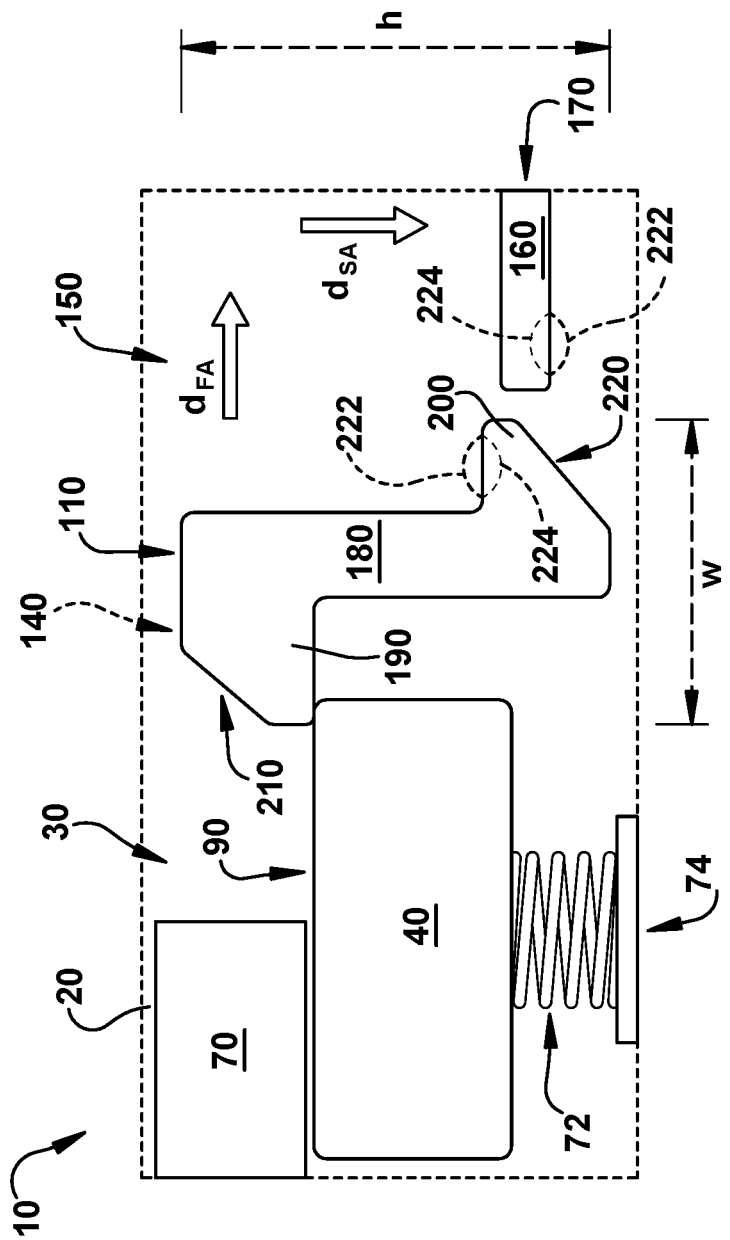
FIG. 2 shows a cross-sectional depiction of a portion of the device of FIG. 1.

Turning to FIG. 2, in various implementations, the device 10 further includes a terminal spring 72 coupled with a terminal 74 for contacting the battery 40. The terminal spring 72 can sit within the cavity 30 and exert a spring force against the underside of battery 40 when installed. As installed, the battery 40 is pushed upward by the spring 72 to contact the lip 70, such that there is negligible or no clearance between the battery 40 and the lip 70. In any case, the lip 70 can extend from the body 20 such that it overhangs the battery 40 within the cavity 30. That is, the lip 70 extends at least partially about the cavity 30 (e.g., around the cavity 30 in circumferential terms, when cavity 30 is at least partially circular or arced) and is positioned to partially restrict movement of the battery 40 in the cavity 30.

The device 10 can further include a latch 80 coupled with the body 20 proximate the cavity 30. The latch 80 can be configured to retain the battery 40 in the cavity 30. In particular implementations, the latch 80 requires multi-stage actuation to permit removal of the battery 40 from the cavity 30. That is, according to various implementations, the battery 40 is retained in the cavity 30 by the lip 70 and the latch 80 until the multi-stage actuation of the latch 80 is complete. In this sense, the lip 70 and the latch 80 work in concert to retain the battery 40 in the cavity 30.

In particular implementations, the multi-stage actuation of the latch 80 requires at least two stages of actuation. For example, in two-stage actuation, a first stage can be performed in a first actuation direction, and a second stage can be performed in a second actuation direction (distinct from the first actuation direction). FIG. 1 illustrates one example implementation of device 10 with latch 80 having a multi-stage actuation mechanism. In this example, as indicated by dashed arrows in FIG. 1, the latch 80 is actuatable to translate in a first actuation direction ($d_{FA}$) that is substantially transverse to the outer surface 90 of the battery 40 (e.g., the planar outer surface of battery 40), and to depress in a second actuation direction ($d_{SA}$) distinct from the first actuation direction ($d_{FA}$) transverse to the outer surface 90. That is, the first actuation direction ($d_{FA}$) is in a direction that is substantially parallel to the outer surface 90 of battery 40 (e.g., the upper surface), such that the latch 80 slides along that outer surface 90 to actuate retention of the battery 40 in the cavity 30. In some cases, the first actuation direction ($d_{FA}$) is substantially perpendicular to the second actuation direction ($d_{SA}$) (within approximately 10-15 degrees). In particular cases, the first actuation direction ($d_{FA}$) can include at least some degree of lift (e.g., out of the page) away from the outer surface 90 of the battery 40 such that the latch 80 can be moved completely clear of the outer surface 90 of the battery 40 and subsequently actuated in the second actuation direction ($d_{SA}$). Additionally, as indicated in FIGS. 1 and 2, when battery 40 is installed in device 10, the battery 40 prevents the latch 80 from moving in the second actuation direction ($d_{SA}$) until the latch 80 moves in the first actuation direction ($d_{FA}$).

In certain implementations, the latch 80 includes a cantilever arm 100 coupled with the body 20, along with a locking member 110 coupled with the cantilever arm 100 for engaging the battery 40. In these particular cases, the cantilever arm 100 can be coupled with the body 20 at an attachment site 120, and can be configured to flex in response to a force in the first actuation direction ($d_{FA}$) and the second actuation direction ($d_{SA}$). In various implementations, the cantilever arm 100 is formed of a similar material as the body 20, e.g., a plastic such as acrylonitrile butadiene styrene (ABS) plastic or polycarbonate (PC)/ABS plastic. The cantilever arm 100 can have a thickness which can permit flexion in the actuation directions without significant permanent deformation (e.g., a thickness of 1-2 mm or any thickness suitable of performing the functions described herein). The cantilever arm 100 can have a single attachment site 120, such that a first end 130 of the arm is coupled with the body 20 at that site 120 and a second end 140 of the arm is free to move. However, in other implementations, the latch 80 could be coupled with the body 20 at a set of attachment sites or otherwise pivotably or slideably coupled with the body 20 to move according to the first actuation direction ($d_{FA}$) and the second actuation direction ($d_{SA}$). In some particular cases, the latch 80 can include an arcuate shape (e.g., an arcuate cantilever arm 100, as depicted in the sectional view in FIG. 1) that can have an arcuate path with an arc radius similar to the arcuate shape of the battery 40. However, in other cases, the latch 80 can be shaped and/or sized in any manner to facilitate multi-stage actuation and retention of the battery 40.

In various implementations, the body 20 of the device 10 includes a slot 150 extending from the cavity 30 (e.g., extending at least partially away from the lip 70) that permits the locking member 110 to move in at least the first actuation direction ($d_{FA}$). That is, the slot 150 can extend from the cavity 30 such that the cantilever arm 100 and the locking member 110 can translate from the cavity 30 into the slot 150 and provide clearance for the battery 40 to be installed or removed from the cavity 30. In some cases, as illustrated in the cross-sectional depiction of a portion of device 10 in FIG. 2, the body 20 further includes a seat 160 within the slot 150 for engaging the locking member 110, as described herein. The seat 160 can protrude from a wall 170 of the body 20 within the slot 150, and can extend from that wall 170 a distance sufficient to engage the locking member 110.

As shown in FIG. 1 and FIG. 2, the locking member 110 can be coupled with the second end 140 of the arm, and is positioned to actuatably engage the battery 40 in the cavity 30. In the depiction of FIG. 2, the locking member 110 can further include a main body 180, a first hook 190 extending from the main body 180 for engaging the battery 40 (FIG. 1), and a second hook 200 extending from the main body 180 for engaging the seat 160 within the slot 150. According to some particular implementations, the main body 180 is coupled with the second end 140 of the arm 100, but in some cases, the main body 180 extends from or is continuous with the arm (e.g., where the main body 180 and the cantilever arm 100 are formed from a single piece of material). In some cases, the hooks 190, 200 include protrusions extending from the main body 180, e.g., in opposing directions. In certain implementations, first hook 190 and/or second hook 200 can include one or more tab(s), pin(s), overhang(s) or other member(s) extending from the main body 180 and sized to respectively engage the battery 40 and the seat 160.

In various implementations, the first hook 190 includes a first tapered edge 210, and the second hook 200 includes a second tapered edge 220. The first tapered edge 210 can be angled (e.g., away from the body) to enhance engagement/disengagement with the battery 40. The second tapered edge 220 can be angled (e.g., away from the body) to enhance engagement/disengagement with the seat 160.

In various implementations, the cantilever arm 100 and/or the locking member 110 can be sized to allow engagement by a user, e.g., a human user. That is, according to various implementations, a user can insert a finger, fingernail or tool (e.g., the head of a screwdriver, pin, paper clip or other probe) between the lip 70 and the cantilever arm 100 or the locking member 110, and actuate movement of the latch 80 to permit installation or removal of the battery 40 from the cavity 30. As illustrated in FIGS. 1 and 2, during multi-stage actuation of the latch 80, the locking member 110 can be translated (or, slid) from a resting position into the slot 150, and can then be depressed (or, pushed) downward, to provide clearance to permit installation or removal of the battery 40 from the cavity 30. In particular cases, as described herein, the second hook 200 can be used to engage the seat 160 in the slot 150 so as to free the user to install or remove the battery 40 without needing to simultaneously hold the latch 80, after the multi-stage actuation is complete.

Figure 3:
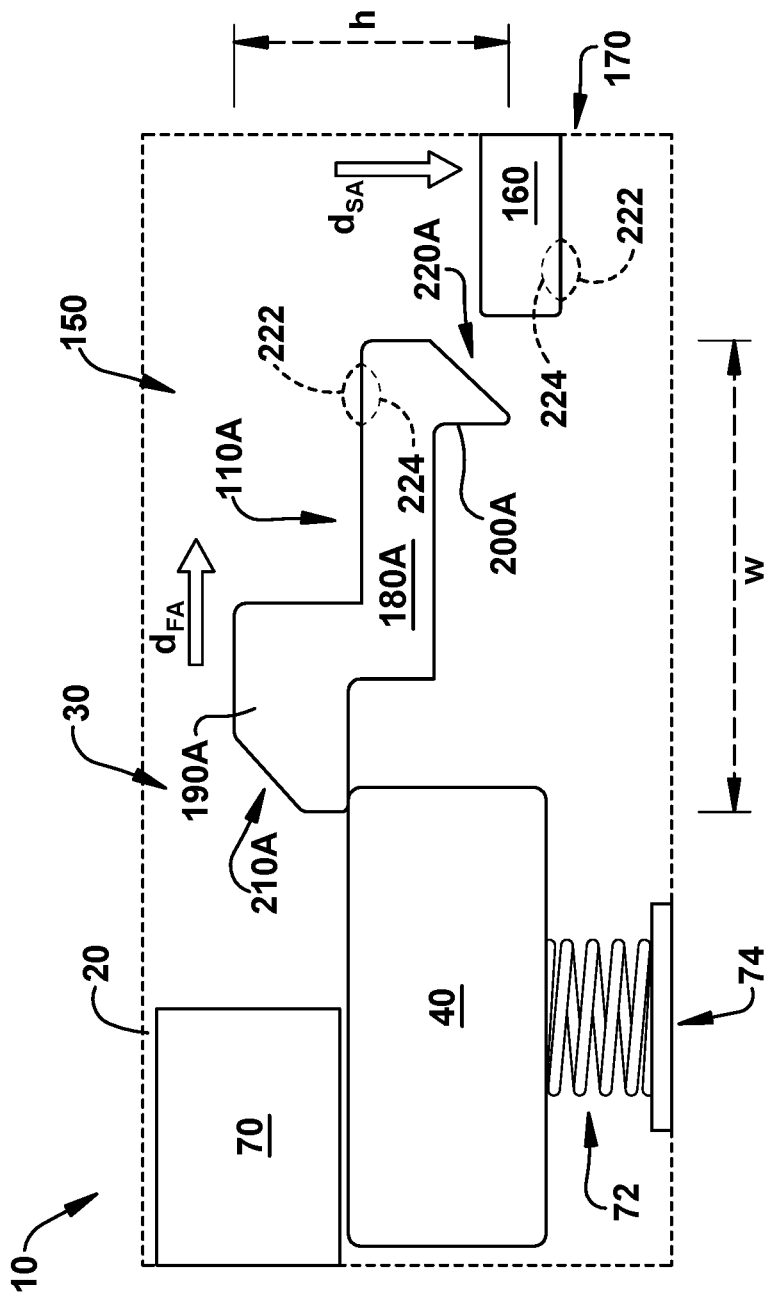
FIG. 3 shows a cross-sectional depiction of a locking member according to various implementations.

FIG. 3 illustrates an additional implementation of a locking member 110A, with a main body 180A and corresponding first hook 190A and second hook 200A for engaging the battery 40 and seat 160, respectively. In this implementation, the main body 180A has a greater width (w) than height (h), as compared with the locking member 110 in FIG. 2, which has a greater height (h) than width (w) (as measured in the cross-section taken through locking members 110, 110A in FIGS. 2 and 3). The width (w) can be measured in a direction substantially parallel (e.g., within a several degrees variation) of the first actuation direction ($d_{FA}$), and the height (h) can be measured in a direction substantially perpendicular (e.g., within several degrees variation) to the first actuation direction ($d_{FA}$).

In some example implementations, as shown in phantom (as optional) in FIGS. 2 and 3, the locking members 110, 110A and/or the seat 160 can include a protrusion 222 or a corresponding recess 224 for retaining the locking member 110, 110A in contact with the seat 160. That is, in some cases, the locking member 110, 110A can include a protrusion 222 extending from a surface (e.g., an upper surface) of the second hook 200 (or from a surface of the body 180A in the case of locking member 110A). The protrusion 222 can be positioned to engage either a corresponding protrusion 222 (extending from a surface of the seat 160, such as a lower surface) or a corresponding recess 224 (formed in the seat 160, e.g., at the lower surface). In some cases, protrusion 222 can include a rounded nub configured to slide into and out of a corresponding recess 224 (which may have a rounded interface to correspond with protrusion 222, or may take another shape), or to slide over and around a corresponding protrusion 222 (e.g., in the case where both locking member 110, 110A and seat 160 have a protrusion 222. However, in other cases, the protrusion 222 can include an angled interface for interacting with a surface of one of the locking member 110, 110A or seat 160, or with an interface of another protrusion 222 or a recess 224. In some particular implementations, the locking members 110, 110A can include a recess 224 for receiving a protrusion 222 located on the seat 160.

Figure 4:
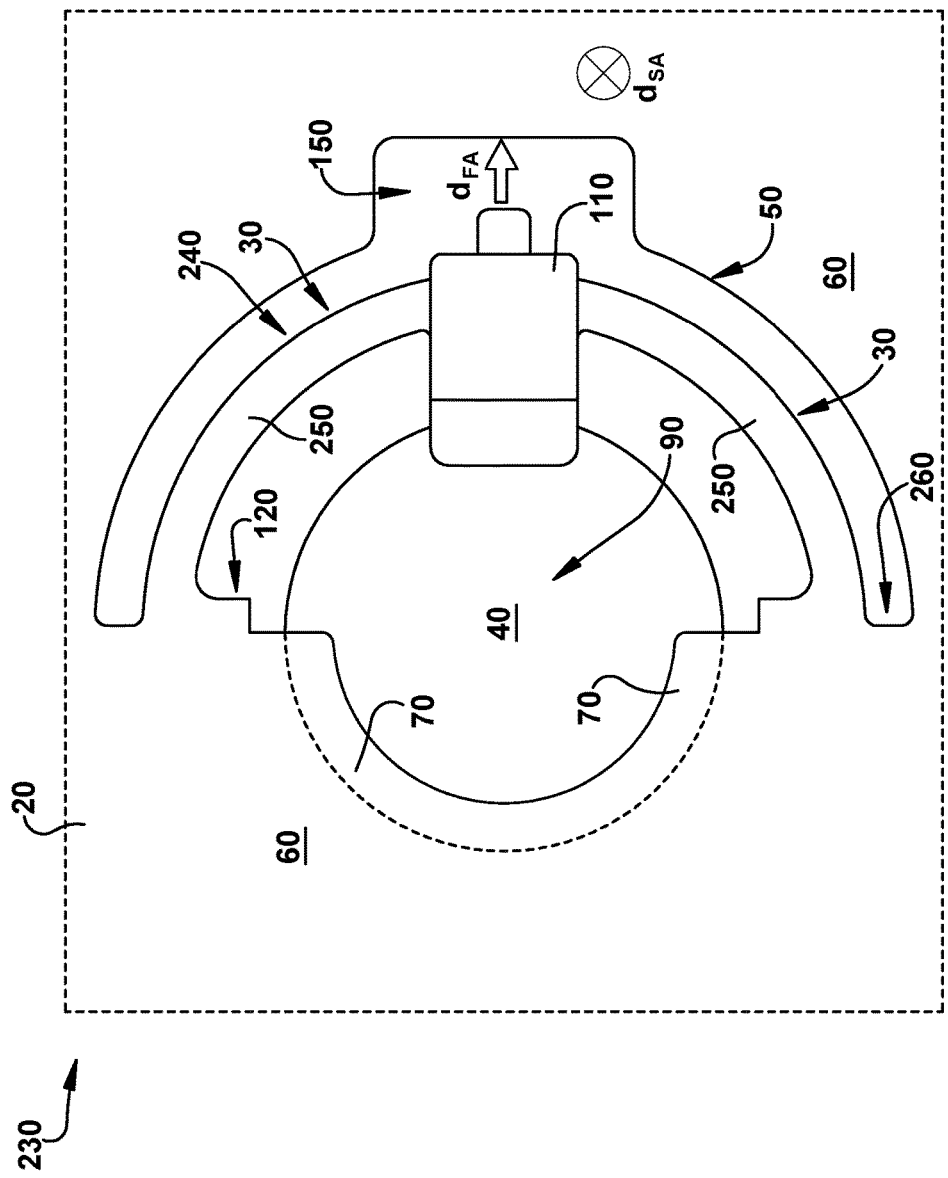
FIG. 4 shows a sectioned plan view of a device according to various additional implementations.

FIG. 4 illustrates a sectioned plan view of a device 230 according to various additional implementations. Various features of device 230 are similar to those shown and discussed with reference to device 10 in FIGS. 1 and 2, and as such, similarly labeled features are not redundantly described. In these implementations, device 230 is shown including a spring-arm latch (or, latch) 240. The latch 240 includes a spring arm 250 (which can include one or more segments) coupled with the body 20, and a locking member 110 (which can include variation of locking member 110A) coupled with the spring arm 250 for engaging the battery 40. In these implementations, the spring arm 250 is coupled with the body 20 at two distinct locations (e.g., first attachment site 120 and a second attachment site 260), and is configured to flex such that the locking member 110 can engage/disengage the battery 40 and a seat 160 in the slot 150, as described herein.

As with the cantilever arm 100 described with respect to FIG. 1, the spring arm 250 is also configured to flex in response to a force in a first actuation direction ($d_{FA}$) and a second actuation direction ($d_{SA}$). In some cases, movement of the latch 240 may be similar to the movement of the latch 80 such that the first actuation direction ($d_{FA}$) and the second actuation direction ($d_{SA}$) are substantially similar to those corresponding directions described with respect to FIG. 1. However, it is understood that structural distinctions between the spring arm 250 and cantilever arm 100 may result in distinct actuation directions between these latch configurations. For example, the first actuation direction ($d_{FA}$) of spring arm 250 may follow a substantially straight line, while the first actuation first actuation direction ($d_{FA}$) of cantilever arm 100 (FIG. 1) may follow an at least partially arcuate path. This distinction can be due in part to the additional attachment site 260 in the latch 240. In particular implementations, the spring arm 250 spans substantially about (e.g., across a portion of) the cavity 30 between the first attachment site 120 and the second attachment site 260.

In some implementations, the spring arm 250 is formed of a material such as a plastic described herein, or a metal (e.g., a spring steel such as a 1095 carbon spring steel or a 301 stainless spring steel), however, in other implementations, the spring arm 250 is formed of a plastic such as any plastic described herein. In any case, the spring arm 250 is flexible to permit installation and removal of battery 40 from the cavity 30. Additionally, as described with respect to device 10, in the implementations of device 230, the battery 40 is retained in the cavity 30 by the lip 70 until the multi-stage actuation of the latch 240 is complete.

Figure 5:
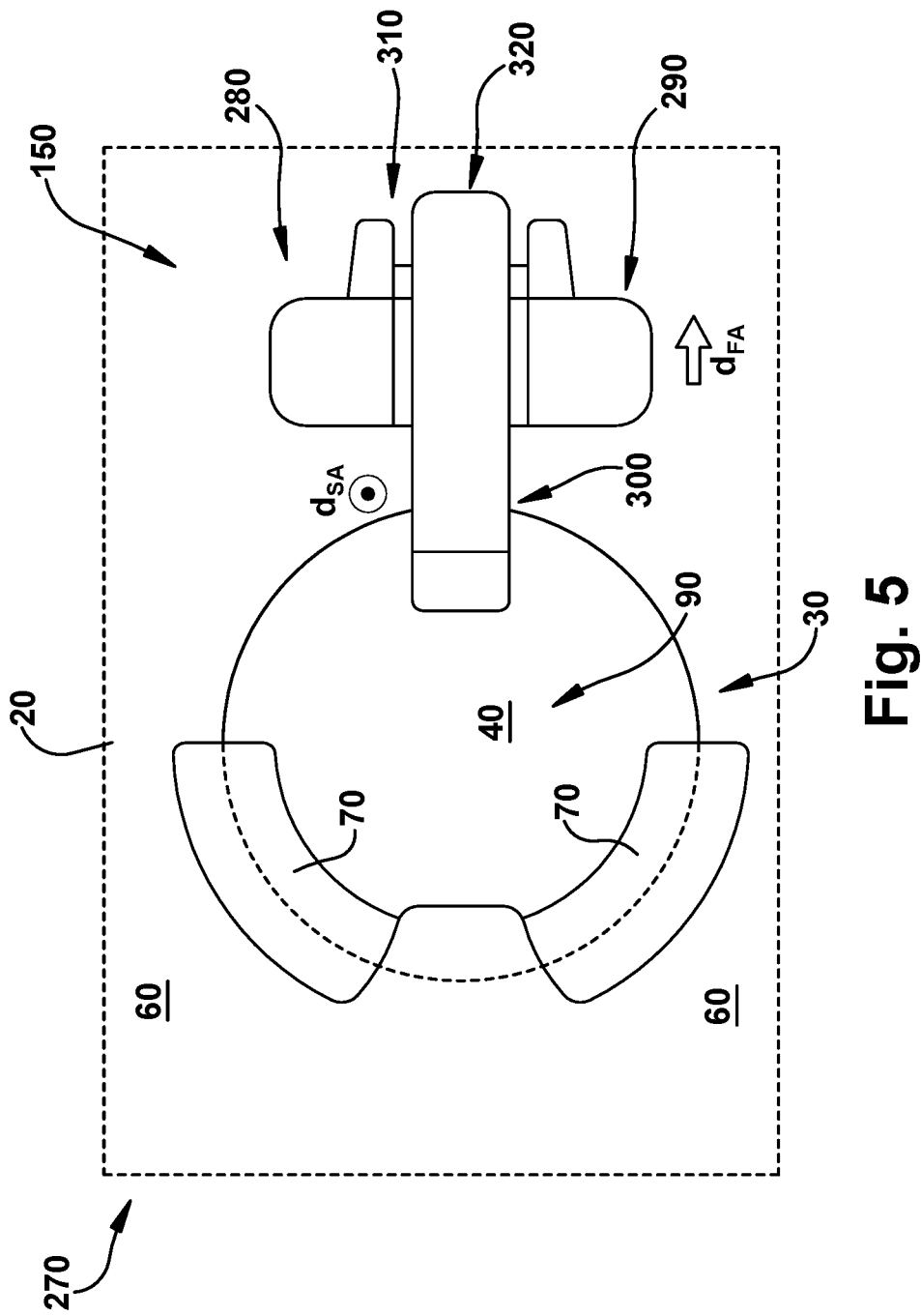
FIG. 5 shows a sectioned plan view of a device according to various further implementations.

FIG. 5 shows a shows a sectioned plan view of a device 270 according to various additional implementations. Various features of device 270 are similar to those shown and discussed with reference to device 10 and device 230 described herein, and as such, similarly labeled features are not redundantly described. In these implementations, device 270 is shown including a post-lock latch (or, latch) 280. The latch 280 can include a post 290 coupled with the body 20, and a locking member 300 coupled with the post 290 for engaging the battery 40. FIG. 6 shows a side view of the latch 280, further illustrating the post 290 and locking member 300. FIGS. 5 and 6 are referred to simultaneously.

Similarly to device 10 and device 230 described herein, device 270 can be configured to retain a battery 40 within the cavity 30. Device 270 can similarly include a lip 70 for at least partially retaining the battery 40 in cavity 30. Additionally, the latch 280 is flexible to permit installation and removal of battery 40 from cavity 30. That is, as shown in FIGS. 5 and 6, the latch 280 is configured to flex in response to a force in a first actuation direction ($d_{FA}$) and pivot in response to a force in a second actuation direction ($d_{SA}$). In some cases, the post 290 is configured to flex or bend around its primary axis (app), and the locking member 300 is configured to pivot relative to the post 290.

In particular implementations, the post 290 includes an internal slot 310, visible in FIG. 5. The internal slot 310 can include an opening extending partially through the post 290, e.g., along its primary axis (app). In some cases, as shown in FIG. 5 and illustrated in phantom in FIG. 6, the locking member 300 is pivotably attached to the post 290 at the internal slot 310. That is, the locking member 300 can be coupled with the post 290 such that locking member 300 can pivot relative to the post 290 to provide clearance for the battery 40. In some cases, the locking member 300 can be connected to the post 290 via a shaft, pin, bearings, or other coupler configured to permit rotation of locking member 300 relative to post 290.

As shown in FIG. 6, in some cases, the locking member 300 further includes an actuatable tab 320 for pivotably engaging the locking member 300, e.g., to engage or disengage the battery 40. The actuatable tab 320 can include any piece of material sized to permit actuation, e.g., by a human user. For example, the actuatable tab 320 can be sized to permit a user to manipulate the locking member 300 with one or more digits, e.g., a fingertip or fingernail. Additionally, the locking member 300 can rest below the terminal end 330 of the post 290 such that a user can contact the post 290 and cause the post 290 to flex away from the battery 40. Further, the locking member 300 can include a tapered edge 340 for engaging the battery 40 and easing installation of the battery 40 into the cavity 30. In some implementations, the locking member 300 is configured to pivot about a point P, illustrated in one example in FIG. 6. It is understood that pivot point P could be located at any point where locking member 300 is configured to pivot relative to the post 290, and that point P in FIG. 6 is merely illustrative of various implementations. Additionally, as described with respect to device 10 and device 230, in the implementations of device 270, the battery 40 is retained in the cavity 30 by the lip 70 until the multi-stage actuation of the latch 280 is complete (FIG. 5).

In any case, the devices disclosed according to various implementations (e.g., devices 10, 230, 270) are configured to permit installation and removal of a battery 40 to/from a cavity 30 according to prescribed standards. These devices utilize a multi-stage actuation mechanism (e.g., latch) and a lip configuration to control retention of the battery 40 relative to the cavity 30, and avoid unwanted separation of the battery 40 from cavity 30.

In various implementations, components described as being "coupled" to one another can be joined along one or more interfaces. In some implementations, these interfaces can include junctions between distinct components, and in other cases, these interfaces can include a solidly and/or integrally formed interconnection. That is, in some cases, components that are "coupled" to one another can be simultaneously formed to define a single continuous member. However, in other implementations, these coupled components can be formed as separate members and be subsequently joined through known processes (e.g., soldering, fastening, ultrasonic welding, bonding, mechanical linking). Additionally, components described herein may be formed via any conventional manufacturing processes, e.g., molding, casting, forging or three-dimensional printing. Additionally, sub-components within a given component can be considered to be linked via conventional pathways, which may not necessarily be illustrated.

A number of implementations have been described. Nevertheless, it will be understood that additional modifications may be made without departing from the scope of the inventive concepts described herein, and, accordingly, other implementations are within the scope of the following claims.

We claim:

1. A device comprising:
   a body;
   a cavity within the body for holding a battery, wherein the battery comprises a cell-type battery;
   a lip extending at least partially about the cavity; and
   a latch coupled with the body proximate the cavity for regulating movement of the battery in the cavity, wherein the latch requires multi-stage actuation to permit removal of the battery from the cavity,
   wherein the latch is actuatable to translate in a direction transverse to an outer surface of the battery and to depress in a direction substantially perpendicular to the direction transverse to the outer surface.

2. The device of claim 1, wherein the cavity comprises an opening at an exterior wall of the body.

3. The device of claim 1, wherein the lip partially restricts movement of the battery in the cavity.

4. The device of claim 1, wherein the multi-stage actuation includes two-stage actuation.

5. The device of claim 4, wherein the two-stage actuation includes a first stage in a first actuation direction and a second stage in a second actuation direction distinct from the first actuation direction.

6. The device of claim 1, wherein the latch includes:
   a cantilever arm coupled with the body; and
   a locking member coupled with the cantilever arm for engaging the battery.

7. The device of claim 6, wherein the body further comprises:
   a slot extending from the cavity; and
   a seat within the slot.

8. The device of claim 7, wherein the locking member further comprises:
   a main body;
   a first hook extending from the main body for engaging the battery; and
   a second hook extending from the main body for engaging the seat within the slot.

9. The device of claim 8, wherein the first hook comprises a first tapered edge, and wherein the second hook comprises a second tapered edge.

10. The device of claim 1, wherein the latch comprises:
    a spring arm coupled with the body; and
    a locking member coupled with the spring arm for engaging the battery.

11. The device of claim 10, wherein the spring arm is coupled with the body at two distinct locations and spans substantially across the cavity.

12. The device of claim 10, wherein the body further comprises:
    a slot extending from the cavity; and
    a seat within the slot, and
    wherein the locking member further comprises:
       a main body;
       a first hook extending from the main body for engaging the battery; and
       a second hook extending from the main body for engaging the seat within the slot.

13. The device of claim 12, wherein the first hook comprises a first tapered edge, and wherein the second hook comprises a second tapered edge.

14. The device of claim 1, wherein the latch comprises:
    a post coupled with the body; and
    a locking member coupled with the post for engaging the battery.

15. The device of claim 14, wherein the post comprises an internal slot, and wherein the locking member is pivotably attached to the post at the internal slot.

16. The device of claim 14, wherein the locking member further comprises an actuatable tab for pivotably engaging the locking member to engage or disengage the battery.

17. The device of claim 1, wherein the lip extends over the cavity to partially retain the battery, wherein the battery is retained in the cavity by the lip until the multi-stage actuation of the latch is complete.

18. The device of claim 1, wherein the device includes a remote control device.

19. A device comprising:
    a body;
    a cavity within the body for holding a battery;
    a lip extending at least partially about the cavity, wherein the lip extends over the cavity to partially retain the battery; and
    a latch coupled with the body proximate the cavity for regulating movement of the battery in the cavity, wherein the latch requires multi-stage actuation to permit removal of the battery from the cavity,
    wherein the battery is retained in the cavity by the lip until the multi-stage actuation of the latch is complete.

20. A device comprising:
    a body;
    a cavity within the body for holding a battery;
    a lip extending at least partially about the cavity; and
    a latch coupled with the body proximate the cavity for regulating movement of the battery in the cavity, wherein the latch requires multi-stage actuation to permit removal of the battery from the cavity,
    wherein the latch is actuatable to translate in a direction transverse to an outer surface of the battery and to depress in a direction substantially perpendicular to the direction transverse to the outer surface,
    wherein the device includes a remote control device.

* * * * *